United States Patent [19]

Hashishita

[11] Patent Number: 5,185,723
[45] Date of Patent: Feb. 9, 1993

[54] SEMICONDUCTOR INTEGRATED CIRCUIT DEVICE HAVING LOAD MEANS

[75] Inventor: Ryuichi Hashishita, Tokyo, Japan

[73] Assignee: NEC Corporation, Tokyo, Japan

[21] Appl. No.: 865,897

[22] Filed: Apr. 9, 1992

Related U.S. Application Data

[62] Division of Ser. No. 440,093, Nov. 22, 1989, abandoned.

[51] Int. Cl.⁵ .............................................. G11C 13/00
[52] U.S. Cl. .............................. 365/226; 365/189.09; 365/203
[58] Field of Search ........... 365/226, 227, 203, 189.09, 365/189.07

[56] References Cited

U.S. PATENT DOCUMENTS 4,953,127  8/1990  Nagahashi et al. ............... 365/226

Primary Examiner—Terrell W. Fears

[57] ABSTRACT

A semiconductor integrated circuit device comprises a first power source terminal, a second power source terminal, a wiring layer, a plurality of driving transistors, and load elements. The load elements are connected in parallel between the wiring layer and the first power source terminal and disposed at respective ends of the conductor. Transfer gate elements may be provided between the wiring layer and the load elements for separating the load elements from the driving elements.

3 Claims, 6 Drawing Sheets

SEMICONDUCTOR INTEGRATED CIRCUIT DEVICE HAVING LOAD MEANS

This is a division, of application Ser. No. 07/440,093, filed Nov. 22, 1989 now abandoned.

BACKGROUND OF THE INVENTION

1. Field of the Invention

The present invention relates to a semiconductor integrated circuit device and, more particularly, to a semiconductor integrated circuit device having a logic circuit or a memory cell array in which a wiring having a relatively high electrical resistance is formed and a plurality of driving elements or driving circuits and load means are connected to the wiring.

2. Description of Related Art

A conventional logic circuit is, for example, constructed such that a plurality of N-channel insulated gate field effect transistors (hereinafter called "transistors") are connected to nodes of a polycrystalline silicon (hereinafter called "polysilicon") wiring at their drain regions, to a ground potential line at their source regions and to signal lines, from which input (driving) signals are applied, at their gate electrodes, respectively. Between an output terminal and one end node nearest to the output terminal among the nodes of the polysilicon wiring, a sense inverter is formed, and a P-channel transistor as a load element is connected to a line between the one end node and the sense inverter at its drain region, to a power source voltage line ($V_{DD}$ line) at its source region and to a ground potential line at its gate electrode.

The aforementioned circuit functions as an OR circuit, that is, when the level of any one of the input signals applied to the gate electrodes of the driving transistors becomes "H", meaning the level of the input signal is high, the potential of the end node or the line connected to the end node goes down and thus the level of the output signal at the output terminal becomes "H". The channel width and the channel length of each of the transistors in the circuit is so determined that the potential of the end node, which has gone down due to the driving operation of one of the driving transistors, becomes lower than the threshold value of the sense inverter. The sense inverter functions so that the potential of the end node is changed to the potential of the power source voltage ($V_{DD}$) or the ground potential and the resultant voltage is outputted from its output terminal.

The polysilicon wiring has an electrical resistance larger than a metallic wiring, and therefore, unfavorable resistors are inevitably caused in the wiring between respective nodes. In the prior art, however, any load element is not connected at the side of the other end node remoted from the output terminal. Therefore, variation of circuit characteristics by respective driving transistors becomes large and misoperations of the circuit are apt to occur. If a current flowing through the load transistor connected to the output side is of a small value, a high speed operation of the circuit cannot be obtained.

SUMMARY OF THE INVENTION

It is an object of the present invention to provide a semiconductor integrated circuit in which a potential state in a wiring layer is controlled by a plurality of driving elements connected to nodes of the wiring layer, and in which the variation of the potential state by driving elements is minimized.

It is another object of the present invention to provide a semiconductor integrated circuit in which the operating speed of the device is improved.

According to the present invention, there is provided a semiconductor integrated circuit device on a semiconductor substrate comprising a first power voltage terminal line for supplying a first voltage, for example, a positive voltage $V_{DD}$; a second power voltage terminal line for supplying a second voltage, for example, zero volt, i.e. ground potential GND; a wiring layer; a plurality of driving means connected between nodes at every portion of said wiring layer and the second power voltage terminal line; a first load element electrically connected between one end of the wiring layer and the fist power voltage terminal line, and a second load element electrically connected between the other end of the wiring layer and the first power voltage terminal line. Further, first and second switching means may be formed between the one end of the wiring layer and the first load element and between the other end of the wiring layer and the second load element, respectively.

BRIEF DESCRIPTION OF THE DRAWINGS

The foregoing and other objects are effected by the invention as will be apparent from the following description and claims taken in connection with the accompanying drawings, forming a part of this application, in which:

FIG. 3b shows a layout of the circuit of FIG. 3a;

FIG. 4 shows an equivalent circuit diagram to assist in illustrating the performance of the circuit shown in FIG. 3a;

PREFERRED EMBODIMENTS OF THE INVENTION

Figure 1:
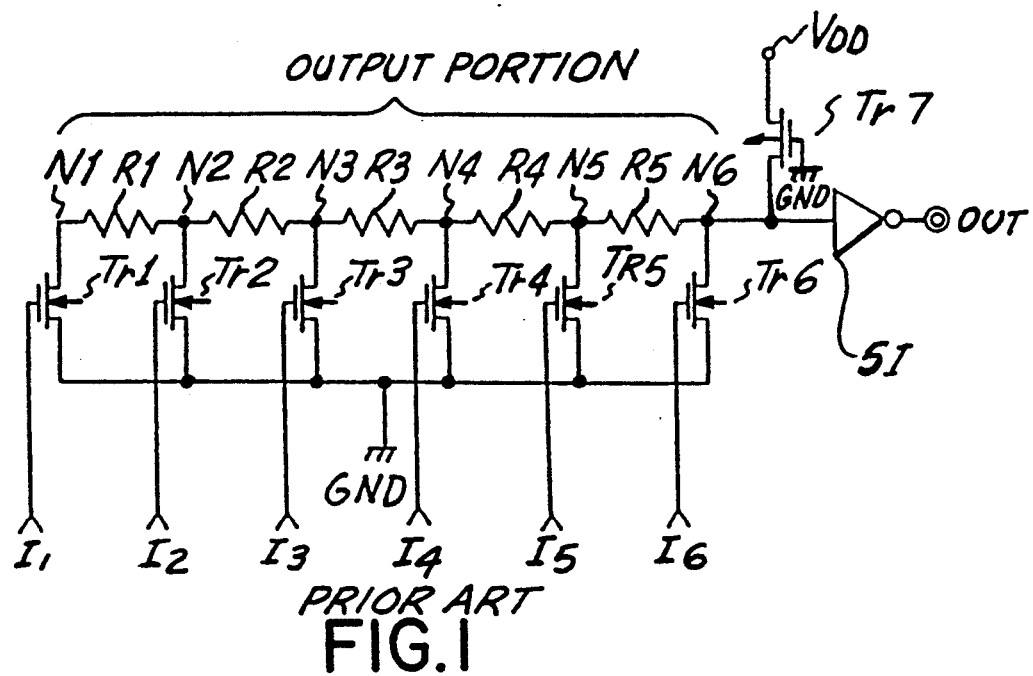
FIG. 1 shows a circuit diagram of a conventional semiconductor circuit.

Throughout the following description, similar reference numerals refer to similar elements in all Figures of the drawings.

FIG. 1 shows a conventional semiconductor integrated circuit having a load element. In such a circuit, polysilicon wiring is used in an output portion thereof and a plurality of N-channel transistors Tr1-Tr6 are connected, as driving transistors, between the respective nodes N1-N6 and the ground (GND). There exist respective resistors R1-R5, formed in polysilicon wiring, between the nodes N1-N2, N2-N3, N3-N4, N4-N5, and N5-N6. All the driving transistors Tr1-Tr6 have the same gate width and the same gate length. Binary input signals I1-I6 are applied to the gate electrodes of the driving transistors Tr1-Tr6, respectively.

Between a power source terminal $V_{DD}$ and the node N6 of the output end side, there is connected a P-channel transistor Tr7 as a load element. It is to be noted that there is only one load element in this circuit. A sense inverter SI is connected to the end node N6 so that the potential of this node N6 is changed to the potential of the power source voltage $V_{DD}$ or the ground potential and the resultant voltage is outputted from its output terminal OUT.

The above-mentioned circuit functions as an OR circuit, that is, when the level of any one of the input signals I1–I6 applied to the gate electrodes of the driving transistors Tr1–Tr6 becomes "H", the potential of the node N6 goes down and accordingly the level of the output at the output terminal OUT becomes "H". The channel width and the channel length of each of the transistors Tr1–Tr7 is so determined that the potential of the node N6, which has gone down due to the driving operation of one of the driving transistors Tr1–Tr6, becomes lower than the threshold value of the sense inverter SI.

Now, let us consider the respective instances wherein only the input signal I6 is "H" and the input signal I1 is "H". As seen from FIG. 2, which shows characteristic curves of each of the transistors with the current I flowing therein taken on the vertical axis and the potential V of the node N6 on the horizontal axis, the respective intersections of the curve for the load transistor Tr7 and each curve for the driving transistors Tr1–Tr6 are the respective operating points. The current flowing in the driving transistor Tr6 when the input signal I6 is "H" is shown by $i_6$, the current flowing in the transistor Tr1 when the input signal I1 is "H" is shown by $i_1$, and the current flowing in the load transistor Tr7 is shown by $i_7$. It is noted that, when only the input signal I6 is "H", the operating point is P6 and the potential of the node N6 then is $V_A$ whereas, when only the input signal I1 is "H", the current to flow in the Tr1 decreases due to the fall of the potential by the resistors R1–R5 and the operating point then will be P1 on the graph and the potential of the node N6 will be $V_B$.

Figure 2:
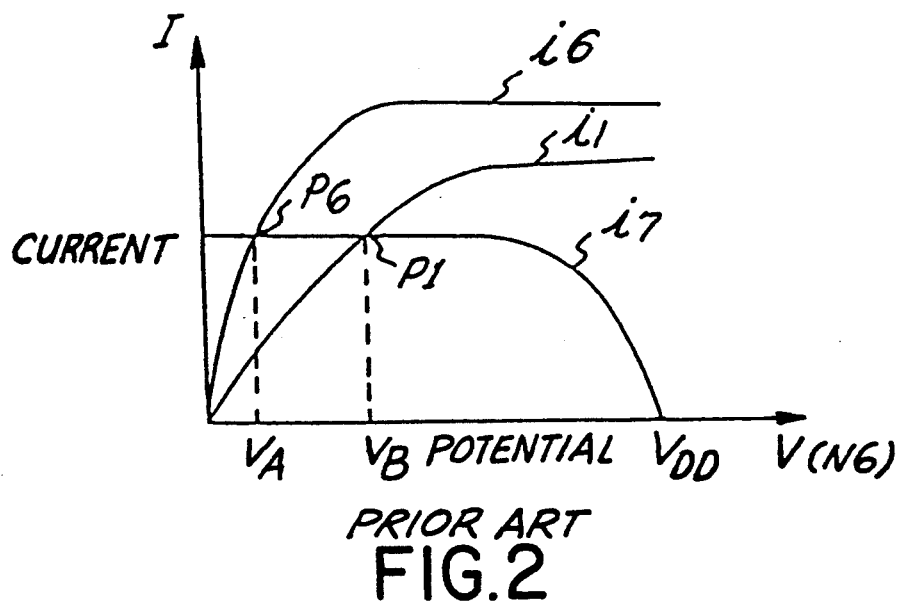
FIG. 2 shows a graph illustrating the behavior of the circuit shown in FIG. 1.

In the semiconductor integrated circuit device as hereinabove explained with reference to FIGS. 1 and 2, the disadvantages were found in that the operating points widely varied depending on which transistor among the plurality of driving transistors Tr1–Tr6 was performing the driving and that the device allowed only small operating margins to take into account such variations in the transistor characteristics (e.g., threshold voltage) as those due to fluctuations in the power supply voltage and due to various reasons associated with the manufacture. These disadvantages caused malfunction of the circuit device. In order to avoid such malfunction, an attempt may be made to make the load element smaller for reducing the current so as to suppress falling of the potential due to resistance. However, in such an arrangement, when the state wherein, for example, the input signals I1–I5 are "L", meaning the low level, and the input signal I6 is "H", changes to the new state wherein all the input signals I1–I6 are "L", it will take a long time to charge up the end node N6, resulting in the lowering of the operation speed of the device. The above disadvantages of the conventional circuit have been overcome by the present invention.

Now, hereinafter some preferred embodiments of the present invention are explained with reference to the appended drawings.

Figure 3A:
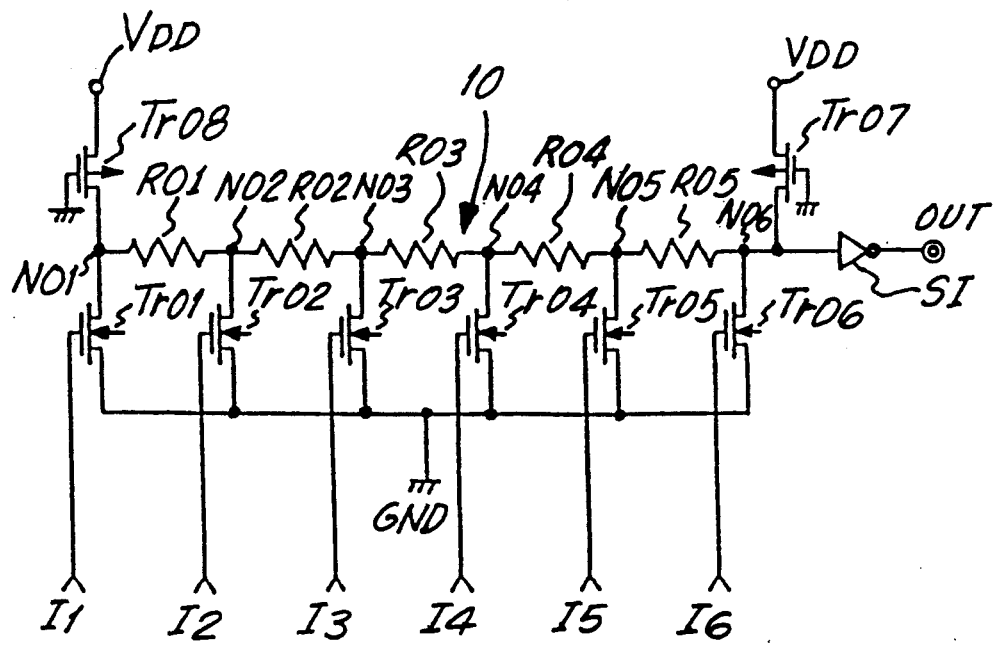
FIG. 3a shows a circuit diagram of a first embodiment of the present invention.

FIG. 3a is circuit diagram of the first embodiment of the present invention. A plurality of N-channel transistors Tr01–Tr06 are connected as driving transistors between the nodes N01–N06 of a polysilicon wiring 10 in an output portion and the ground line GND. Each of the driving transistors Tr01–Tr06 receives at its gate electrode a respective one of the input signals I1–I6. Resistors R01–R05 formed in the polysilicon wiring 10 are provided respectively between the nodes N01–N02, N02–N03, N03–N04, N04–N05 and N05–N06. Between the power source terminal line $V_{DD}$ and the node N06 at one end of the wiring and between the power source terminal line $V_{DD}$ and the node N01 at the other end of the wiring 10, load P-channel transistors Tr07 and Tr08 are electrically connected, respectively. To the end node N06 is connected a sense inverter SI from which the output signal is derived to an output terminal OUT.

Figure 4:
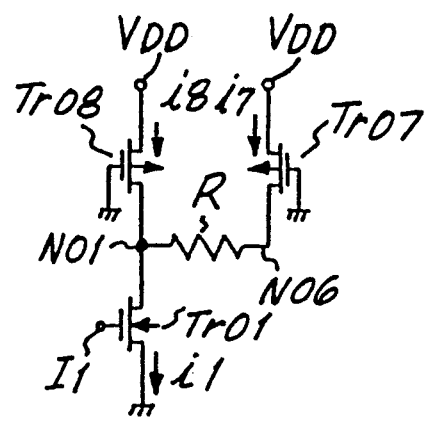

Now, let us consider the state wherein only the input signal I1 is "H" and the remaining input signals I2–I6 are all "L". The equivalent circuit diagram of this state is shown in FIG. 4. In FIG. 4, the reference R is a resistor which includes total resistance values of the series resistors R01–R05, that is, $R = R01 + R02 + R03 + R04 + R05$, $i_1$ is the current which flows in the driving transistor Tr01, $i_7$ is the current which flows in the load transistor Tr07 and, $i_8$ is the current which flows in the other load transistor Tr08. The gate length and the gate width of each of the load transistors Tr07 and Tr08 are determined in such a manner that the current $i_7 + i_8$ equals a predetermined current $i_0$ which is required for completing the charging up of the output portion in a predetermined time period.

Now, if the potential of the node N01 is V(N01) and the potential of the node N06 is V(N06), the following equations may be satisfied:

$$V(N06) = V(N01) + i_7 R$$

$$i_7 + i_8 = i_0.$$

According to the above equations, it can readily be understood that the potential fall will be smaller when the current $i_7$ is small but, since the potential fall at the node N06 becomes greater when only the input signal I6 changes to "H", it is desirable that the currents $i_7$ and $i_8$ may be set so as to be $i_7 \approx i_8 \approx (\frac{1}{2}) \times i_0$. In this manner, no matter which one of the input signals I1–I6 may become "H", the potential at the node N06 will be $$V(N06) \approx V(N01) + (\frac{1}{2}) \times i_0 R$$

and thus the potential fall at the node N06 is reduced to half.

Figure 3B:
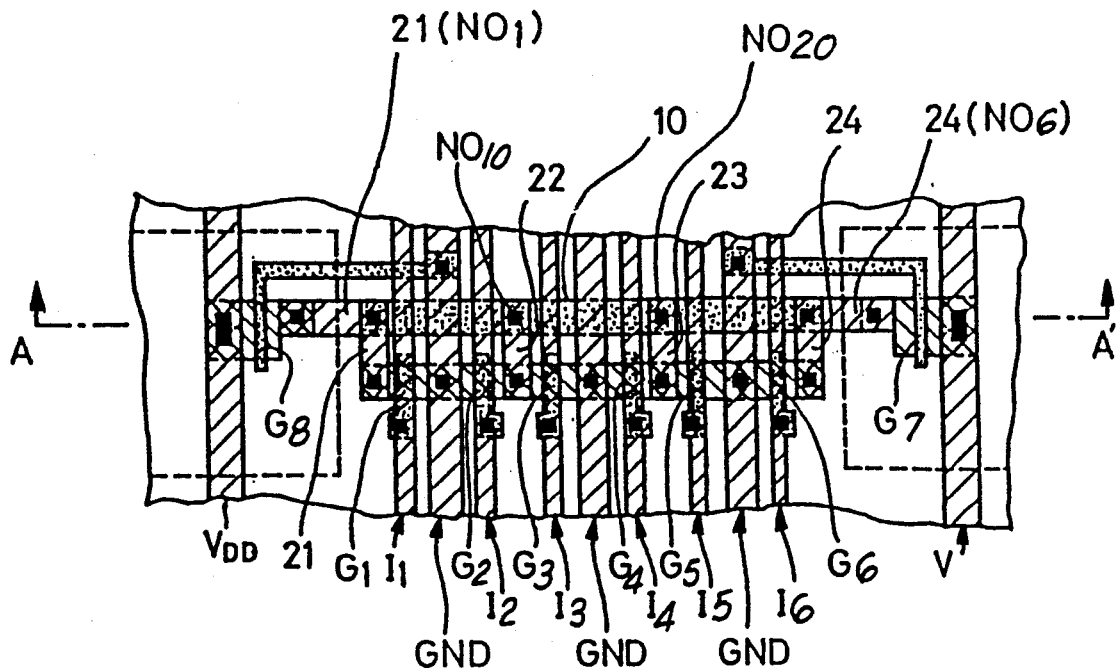
Figure 3C:
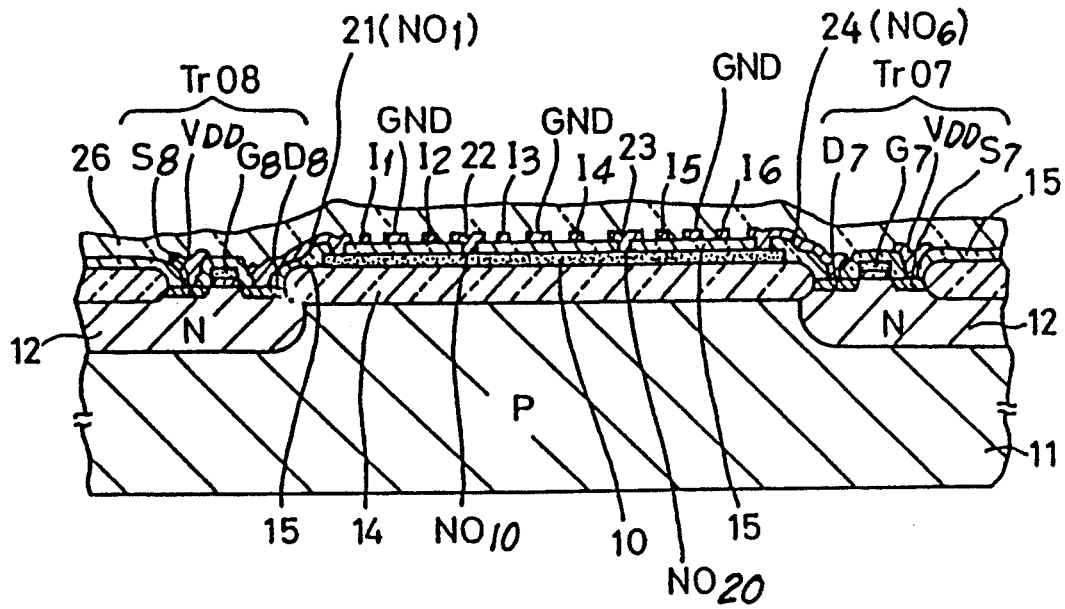
FIG. 3c shows the cross section through the line A—A' in FIG. 3b.

Referring to FIGS. 3b and 3c, a layout structure of the first embodiment will be explained. In the structure, drain regions of Tr02 and Tr03 are commonly connected to a first node $NO_{10}$ of the polysilicon wiring 10, and also drain regions of Tr04 and Tr05 are commonly connected to a second node $NO_{20}$ of the wiring 10. Therefore, the total resistance of resistors R01 to R05 in FIG. 3a may be divided into three portions: between $NO_1$ to $NO_{10}$, $NO_{10}$ to $NO_{20}$ and $NO_{20}$ to $NO_6$. In FIG. 3b, aluminum wiring layers are represented by right-upward hatching; polysilicon wiring layers and polysilicon gate electrodes are represented by dotted areas; source and drain diffusion regions are represented by left-upward hatching; and contacts are represented by solid dark squares and rectangles. The sense inverter SI and the output terminal OUT shown in FIG. 3a are omitted in FIGS. 3b and 3c.

On a major surface of a P-type silicon substrate 11, a field silicon oxide layer 14 is selectively formed. The polysilicon wiring layer 10 is formed on the field insulating layer 14, and N-type source and drain regions of the driving transistors Tr01 to Tr06 are formed in P-type surface sections of the substrate and P-type source and drain regions of the load transistors Tr07 and Tr08 are formed in N-wells 12 of the substrate. The N-type sources of Tr01 and Tr02, of Tr03 and Tr04, and of Tr05 and Tr06 are commonly connected to aluminum ground lines (GND), respectively. Polysilicon gate electrodes $G_1$ to $G_6$ of Tr01 to Tr06 are connected to aluminum signal lines $I_1$ to $I_6$, respectively, and polysilicon gate electrodes $G_7$ and $G_8$ of Tr07 and Tr08 are connected to the ground lines, respectively. The N-type drain region of Tr06 is connected to an end node of the wiring 10 and to the P-type drain region $D_7$ of Tr07 by an aluminum layer 24 which can be regarded as one end node (N06) of the wiring, and also the N-type drain of Tr01 is connected to an end node of the wiring 10 and to the P-type drain region $D_8$ of Tr08 by an aluminum layer 21 which can be regarded as the other end node (N01) of the wiring. The P-type source regions $S_7$ and $S_8$ of Tr07 and Tr08 are connected to aluminum power voltage lines $V_{DD}$, respectively. As mentioned before, N-type drain regions of Tr02 and Tr03 are commonly connected to the first node $NO_{10}$ of the wiring 10 by an aluminum layer 22 and N-type drain regions of Tr04 and Tr05 are commonly connected to the second node $NO_{20}$ of the wiring 20 by an aluminum layer 23. Every contact is conducted via a respective contact throughhole formed in an insulating film 15, and a passivation layer 26 is formed over the entire upper surface of the structure shown in FIG. 3c.

Figure 5:
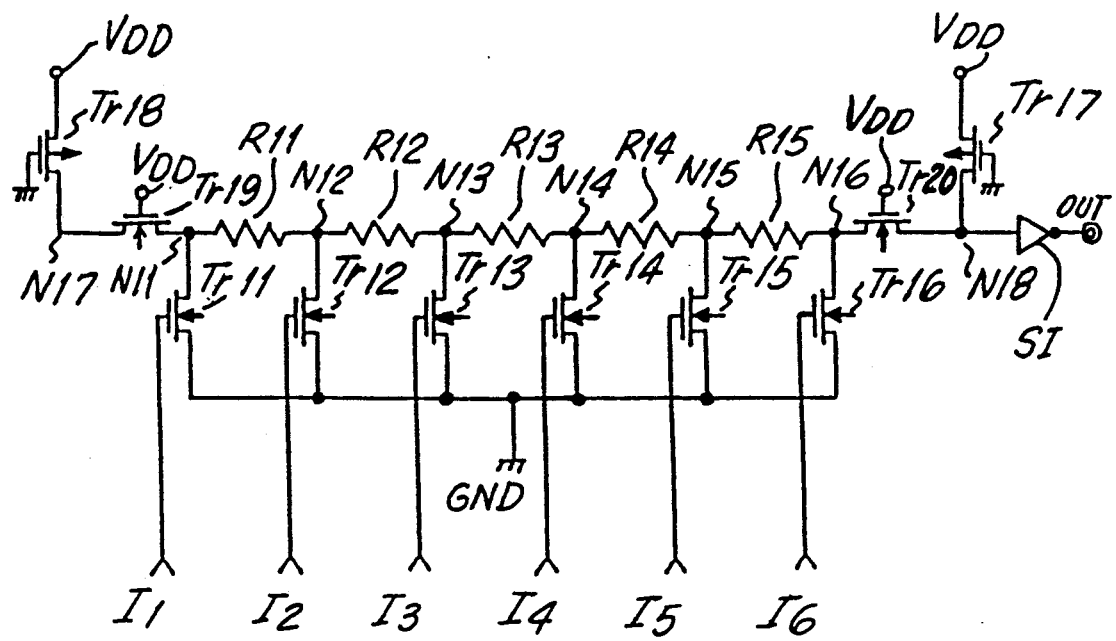
FIG. 5 shows a circuit diagram of a second embodiment of the present invention.

Next, FIG. 5 shows a circuit diagram of the second embodiment of the present invention. In this second embodiment, there are inserted transfer gate transistors Tr19, Tr20 at respective ends of the output conductor portion whereby the section of the driving elements and the section of the load elements are separated from each other. When the input signals I1-I6 are all "L", the potential of each of the nodes N11-N16 is the potential represented by ($V_{DD}-V_T$), that is, the potential lower than the potential of the power source $V_{DD}$ by the threshold value $V_T$ of the transfer gates Tr19, Tr20, which value takes into account the backgate biasing voltage thereof. When the input signal I1 changes its level from "L" to "H", the nodes N11-N16 are discharged through the driving transistor Tr11 and, accordingly the potential of each of the nodes N11, N16 falls until it becomes low enough to cause the transfer gates Tr19 or Tr20 to be turned "ON". Then, the potential of the nodes N17 and N18 starts to fall and, since the nodes N17 and N18 have small capacitance as they are separated from the section of the wiring, the potential fall takes place quickly. Since the nodes N11-N16 have been charged only up to the potential level of ($V_{DD}-V_T$), the charge to be discharged as a whole is small. Thus, this preferred embodiment enables a high speed operation of the device due to the insertion of the transfer gates.

Figure 6:
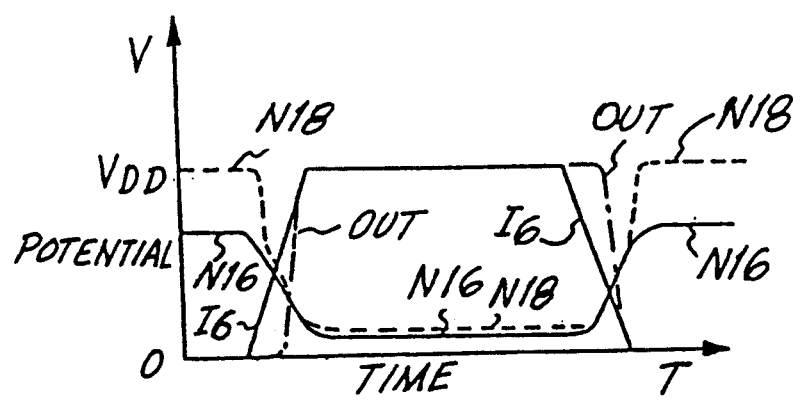
FIG. 6 shows a time chart of the potential of some representative nodes in the circuit shown in FIG. 5.

FIG. 6 is a time chart showing the changes of the potential of some representative nodes and the output terminal OUT in the circuit shown in FIG. 5, in accordance with the changes of the input signal I6. The representative nodes here are the nodes N16 to N18. The vertical axis is for the potential V of the nodes and the horizontal axis is for the time T. It is noted from this chart that in accordance with the changes of the input signal I6 from "L" to "H" or "H" to "L", the potential of the node N18 sharply falls or rises, and this provides an improvement in the operating speed of the device.

Figure 7:
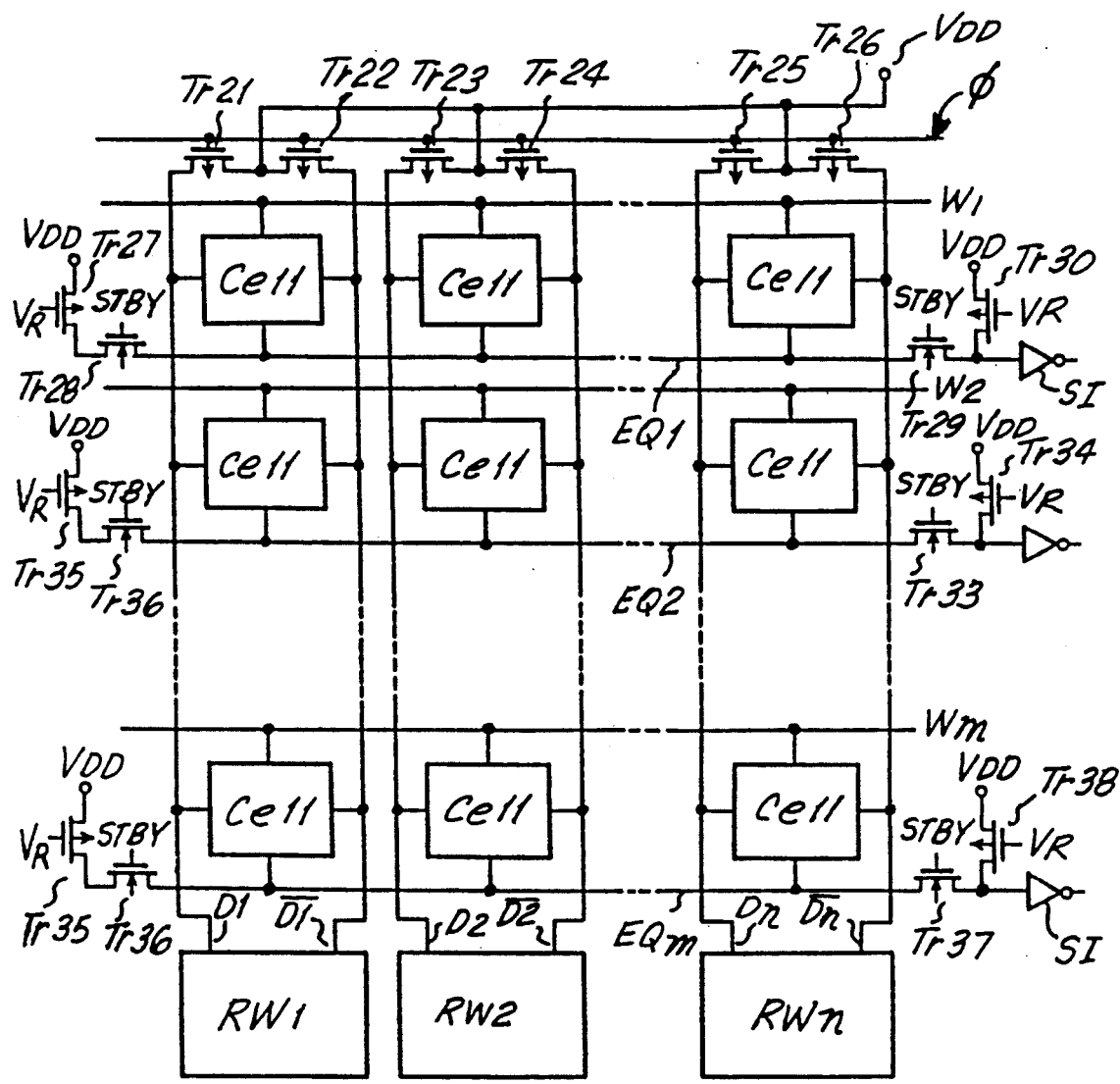
FIG. 7 shows a circuit diagram of a third embodiment of the present invention.
Figure 8:
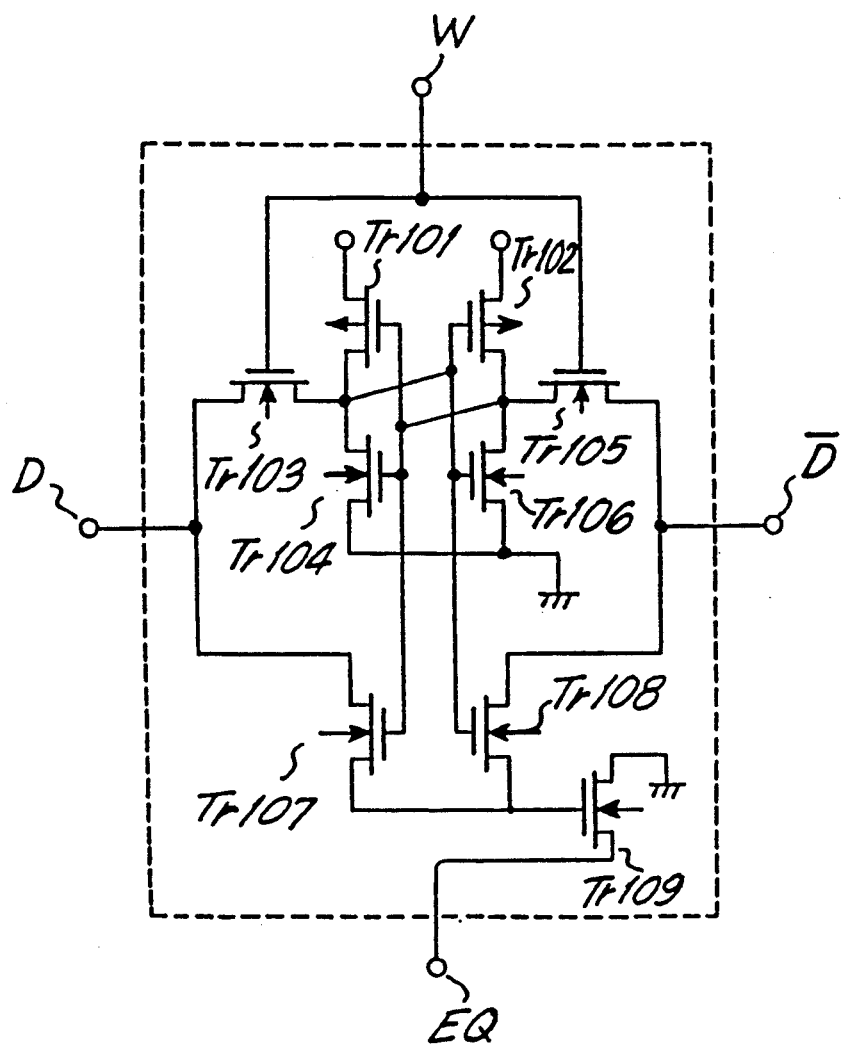
FIG. 8 shows a circuit diagram of a cell contained in the circuit of the third embodiment shown in FIG. 7.

FIG. 7 is a circuit diagram of the third preferred embodiment of the present invention. This circuit includes a plurality of memory cells, each of which, as shown in the circuit diagram in FIG. 8, has transistors Tr101-Tr106 forming an ordinary SRAM (Static random-access memory) of CMOS type and transistors Tr107-Tr109 having a comparison function so that information of digit lines D, $\overline{D}$ is compared with information (1 or 0) of the SRAM and, if they do not match with each other, an output line EQ is discharged to the potential of the GND level through the N-channel transistor Tr109 in the memory cell (FIG. 8).

In the circuit of FIG. 7, during the time period in which the precharge signal $\phi$ is "L", digit lined $D_1-D_n$, $\overline{D}_1-\overline{D}_n$ are kept precharged to the level "H" by transistors Tr21-Tr26. When the precharge signal $\phi$ becomes "H", the precharging stops and read/write circuits $RW_1-RW_n$ operate to render the digit lines $D_x$ or $\overline{D}_x$ (x=1, 2, ... n) to be the level "L". At this point, the information of $D_x$, $\overline{D}_x$ and that of the SRAM portion in each of the cells are compared and, if they do not match with each other, the output line $EQ_Y$(Y=1, 2, ... m) is discharged.

When the performance of the circuit in the process (details not explained herein) of reading out from and writing in the cells is considered, an aluminum wiring layer of low electrical resistance is used for the digit lines $D_1-\overline{D}_n$, $D_1-\overline{D}_n$, thereby using inevitably polysilicon wiring layer of higher electrical resistance for the discharging lines $EQ_1-EQ_m$. Under this circumstance, according to the present invention, there are provided P-type load transistors Tr27 and Tr30, Tr31 and Tr34, Tr35 and Tr38 as load elements respectively at both ends of the respective EQ lines, and this prevents the occurrence of malfunction and lowering of the operating speed of the device. The P-type load transistors are connected to both ends of the EQ lines at their drain regions and to the power source voltage line ($V_{DD}$) at their source regions. To the gates of the load transistors, a reference voltage $V_R$ is applied for controlling the current flowing in the load transistors, respectively. Further, similarly to the second embodiment, in the third embodiment transfer gate transistors Tr28, Tr29, Tr32, Tr33, Tr36 and Tr37 are provided between the ends of the output EO wiring lines and sources of the load transistors, respectively, and a standby signal STBY, which is in the level "L" only during the standby period, is inputted to a gate electrode of each of the transfer gate transistors so that a through-current may be prevented.

In summary, since there are provided at least a pair of the load element at the ends of the wiring layer in the logic circuit or in the memory cell array section, the arrangement according to the invention ensures that, while maintaining the same current supply capacity, the potential fall caused by the resistance in the wiring layer can effectively be suppressed, thereby preventing the occurrence of malfunction and the deterioration in operating speed of the device.

Finally, although in the specific embodiments of the invention described herein, the transistors used have been specified as being N-channel type or P-channel type, it will be understood that either type may be utilized with appropriate changes being made in the polarities of the power source or sources. Also, it will be understood that the embodiment of the invention shown and described is only illustrative and that various modifications may be made therein without departing from the scope and spirit of this invention.

What is claimed is:

1. A semiconductor integrated circuit on a substrate comprising:

a first power source terminal and a second power source terminal;

a wiring layer formed on said substrate;

load elements connected in parallel between said wiring layer and said first power source terminal, at least one each of said load elements being disposed at respective ends of said wiring layer;

a plurality of memory cells, each having transistors forming a static random-access memory circuit and transistors forming a comparison circuit, said comparison circuit having a comparison function thereby to compare a digit line information and an information stored in said memory circuit and discharge the charges on said wiring layer to the ground potential in the absence of matching of the informations; and transfer gate elements provided in said wiring layer, said transfer gate elements separating load elements from said memory cells.

2. A semiconductor integrated circuit device of claim 1, in which said load elements comprise load transistors connectd to said transfer gate elements, said load transistors receiving at their gate electrodes a reference voltage for controlling the current flowing in the load transistors.

3. A semiconductor integrated circuit device of claim 1, in which said transfer gate elements comprise transistors receiving at their gate electrodes a standby signal.

* * * * *

UNITED STATES PATENT AND TRADEMARK OFFICE
CERTIFICATE OF CORRECTION

PATENT NO. : 5,185,723
DATED : February 9, 1993
INVENTOR(S) : Ryuichi Hashishita It is certified that error appears in the above-indentified patent and that said Letters Patent is hereby corrected as shown below:

On the title page, insert the following:

[30]　　　　Foreign Application Priority Data
　　November 22, 1988 [JP] Japan ...... 296676/1988

Signed and Sealed this

Nineteenth Day of April, 1994

Attest:

BRUCE LEHMAN

*Attesting Officer*　　*Commissioner of Patents and Trademarks*